United States Patent
Mori

(10) Patent No.: US 7,480,183 B2
(45) Date of Patent: Jan. 20, 2009

(54) SEMICONDUCTOR MEMORY DEVICE, AND READ METHOD AND READ CIRCUIT FOR THE SAME

(75) Inventor: Toshiki Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 159 days.

(21) Appl. No.: 11/783,799

(22) Filed: Apr. 12, 2007

(65) Prior Publication Data

US 2008/0008007 A1   Jan. 10, 2008

(30) Foreign Application Priority Data

Jul. 5, 2006   (JP) ............................. 2006-185870

(51) Int. Cl.
*G11C 11/34* (2006.01)

(52) U.S. Cl. .............................. 365/185.23; 365/185.2; 365/185.26

(58) Field of Classification Search ................. 365/195, 365/185.23, 185.2, 185.05, 185.13, 230.06
See application file for complete search history.

(56) References Cited

U.S. PATENT DOCUMENTS

| 3,848,236 | A | 11/1974 | Troutman |
| 4,896,298 | A | 1/1990 | Kowalski |
| 5,835,432 | A | 11/1998 | Nakano |
| 6,075,734 | A | 6/2000 | Jang |
| 6,426,906 | B1 * | 7/2002 | Igarashi ...................... 365/204 |
| 6,798,704 | B2 | 9/2004 | Chen et al. |
| 7,382,657 | B2 * | 6/2008 | Hayashi et al. ......... 365/185.25 |
| 2008/0170445 | A1 * | 7/2008 | Mori ...................... 365/189.07 |

FOREIGN PATENT DOCUMENTS

| JP | 2002-109879 A | 4/2002 |
| JP | 2002-216488 A | 8/2002 |

* cited by examiner

*Primary Examiner*—Anh Phung
*Assistant Examiner*—Hien N Nguyen
(74) *Attorney, Agent, or Firm*—McDermott Will & Emery LLP

(57) ABSTRACT

In a semiconductor memory device operative to discharge residual charge in a read bit line in a read cycle, the bit line is in the reset state at all times except during read operation. The reset state of a bit line is canceled when selected and connected to a read circuit for read, and information stored in a selected memory cell is read via the selected bit line. Upon completion of the read of the memory cell, the selected bit line is disconnected from the read circuit and reset to thereby complete discharge of residual charge in the read bit line prior to read operation in the next cycle. This ensures that during read determination operation in the next read cycle, the potential of a selected bit line will not vary with the bit line residual discharge in the previous read cycle.

29 Claims, 11 Drawing Sheets

SEMICONDUCTOR MEMORY DEVICE, AND READ METHOD AND READ CIRCUIT FOR THE SAME

CROSS-REFERENCE TO RELATED APPLICATIONS

This non-provisional application claims priority under 35 U.S.C. §119(a) on Patent Application No. 2006-185870 filed in Japan on Jul. 5, 2006, the entire contents of which are hereby incorporated by reference.

BACKGROUND OF THE INVENTION

The present invention relates to a semiconductor memory device, and more particularly, to a technology effectively applicable to readout of a semiconductor memory device in which a number of memory cells are connected to one bit line and the bit line capacitance is large.

In general, nonvolatile memories such as mask ROMs, PROMs and EPROMs store information by setting each memory cell at either of two states allowing and not allowing current flow between its source and drain when a read voltage is applied.

FIG. 7 shows an exemplary configuration of a mask ROM. A memory 700 includes a memory cell array 102 having memory cells arranged in a matrix. FIG. 8 shows a specific circuit configuration of the memory cell array 102, in which memory cells MC are arranged in a matrix. The gates of memory cells MC in the same rows are commonly connected to same word lines WL0 to WLn. The drains of particular memory cells among memory cells MC in the same columns are commonly connected to same bit lines BL0 to BLm according to data stored in the memory cells. That is, memory cells MC whose drains are connected to the bit lines are memory cells storing data "1", while memory cells whose drains are not connected to the bit lines store data "0". The sources of the memory cells MC are commonly connected and grounded. With this connection of the memory cells MC, when a read voltage is applied to a selected word line WL and bit line BL to read data stored in a selected memory cell, a memory cell current flows from the bit line BL to the ground potential via the memory cell MC if the drain of the memory cell MC is connected to the bit line. If the drain of the memory cell MC is open, no current path occurs from the bit line BL to the ground potential. By determining the current flowing to the selected bit line, data stored in the selected memory cell can be read.

In FIG. 7, a row decoder 108 selects one of the word lines WL running in the memory cell array 102 in response to a row address received externally, and applies a read voltage to the gate electrodes of memory cells MC 102-1 to 102-8. A column decoder 110 outputs bit line selection signals Ysel_0 to Ysel_k for driving a column selection gate 104 in response to a column address received externally. Selection transistors 104-1 to 104-8 in the column selection gate 104, which are driven with the bit line selection signals Ysel_0 to Ysel_k, selectively connect the bit lines connected to the drains of the memory cells MC 102-1 to 102-8 to read determination circuits 114-1 and 114-2.

Read operation for data stored in the selected memory cells MC will be described with reference to FIG. 9. In FIG. 9, ADD denotes an input address signal. In response to an address change with input of address A0 at time t1, the row decoder 108 selects a particular word line, the column decoder 110 activates a particular bit line selection signal Ysel for selecting a particular bit line, and a controller (not shown) in the memory generates a precharge signal PR. On receipt of this precharge signal, precharge transistors 112-1 to 112-3 precharge read nodes NRED-1 and NRED-2 connected to inputs of the read determination circuits 114-1 and 114-2 and a reference input node NREF as the other input of each of the read determination circuits 114-1 and 114-2 to a predetermined potential as shown by NRED/NREF in FIG. 9. In this precharge of the read nodes NRED-1 and NRED-2 to the potential shown, the bit lines BL selected by the column selection gate 104 in response to the bit line selection signal Ysel are also precharged. Once the precharge operation is terminated at time t2, the potentials of the read nodes NRED-1 and NRED-2 are discharged according to cell currents at the selected memory cells. Note herein that two types of memory cells 102, one allowing and the other not allowing current flow, exist depending on whether or not the drain terminal of the memory cell is connected to a bit line. If a memory cell MC whose drain is connected to a bit line BL is selected, the charge stored under the precharge operation is discharged with the memory cell current at and after the time t2. The potential therefore changes over time as indicated by 204. If a memory cell MC whose drain is open is selected, the charge stored under the precharge operation is kept as it is, and thus the potential is as indicated by 202. The potential of the reference node NREF, configured to be discharged with a reference current set at a half of the memory cell current, lies in the middle between the read node potentials 202 and 204, as indicated by 206 in FIG. 9. Sout denotes an output waveform of the read determination circuit 114-1 or 114-2. Read data Sout(S0) is finalized at the time when the potential difference between the read node potential 202 or 204 and the reference potential 206 reaches a value required for stable read operation in the read determination circuits 114-1 and 114-2. At timing t3 at which the read data Sout(S0) from the read determination circuits 114-1 and 114-2 is finalized, a signal DL inputted into clock terminals Cp of latch circuits 118-1 and 118-2 is lowered, to allow the read data from the read determination circuits 114-1 and 114-2 to be latched by the latch circuits 118-1 and 118-2. Output data Dout(D0) is then outputted from the latch circuits 118-1 and 118-2.

Once the latching of the output of the read determination circuits 114-1 and 114-2 by the latch circuits 118-1 and 118-2 is completed, the bit line selection signal Ysel is made "L", releasing the selection of the bit lines and inactivating the read determination circuits 114-1 and 114-2. At the same time, a signal DIS goes "H", and with this, residual charge in the selected bit lines is discharged with transistors 702-1 to 702-8 in a bit line reset circuit 702. The signal DIS is made "L" at the timing of completion of the discharge, to terminate the discharge operation. In this way, one cycle of read operation is completed.

At time t4, an address for next read is inputted, and the read operation cycle described above is repeated.

As described above, in the read method in which the capacitances connected to the read node including a selected bit line and to the reference node are precharged and then discharged with the memory cell current and the reference current to perform readout, residual charge in the selected bit line and the reference node must be discharged after data stored in the memory cell has been read. When all memory cells connected to a selected word line have data "0" and the bit lines are sequentially selected to perform readout, the precharged data will remain in all the bit lines unless post-read bit line discharge is performed. If the address changes in this state to select a word line connected with memory cells MC all having data "1", the residual charge in the bit lines will be discharged at one time via the memory cells MC, causing a malfunction due to noise. To avoid this problem, post-read bit line discharge is performed every read cycle.

In view of the above, the read cycle in the read method described above includes the precharge time and the discharge time in addition to the operation time for memory cell selection by the row decoder 108, the column decoder 110 and the like and the determination time in the read determination circuits 114.

A technology of shortening the precharge time and the discharge time to speed up the read cycle is disclosed in Japanese Laid-Open Patent Publication No. 2002-216488. FIG. 10 shows an exemplary circuit configuration based on the disclosed technology, in which components identical in circuit operation to those in FIG. 7 are denoted by the same reference numerals. A memory 1000 is different from the configuration in FIG. 7 in that bit line reset transistors in a bit line reset circuit 1102 connected to the bit lines BL are controlled, not with the common control signal DIS, but with a plurality of control signals Res0 to Res3. In this example, control is made so that residual charge in a bit line read in a given read cycle is discharged in parallel with the read operation in the next read cycle.

The operation will be described with reference to FIG. 11. In response to an address change with input of address A0 at time t1, the row decoder 108 selects a particular word line, and the column decoder 110 activates a bit line selection signal Ysel_0 corresponding to the address A0. Read operation like the operation described with reference to FIGS. 7 and 8 is performed for a selected memory cell connected to a bit line selected with the bit line selection signal Ysel_0. Data Sout(S0) read by the read determination circuit 114 under the read operation is latched by the latch circuit 118, and data Dout(D0) is outputted. Once the latching of the output of the read determination circuit 114 by the latch circuit 118 is completed, the bit line selection signal Ysel_0 is made "L", releasing the bit line selection and inactivating the read determination circuit 114 to terminate the read operation.

Once the read operation in this cycle is terminated, the address input signal is changed to A1 to start read operation in the next cycle at time t4. Upon receipt of address A1, the column decoder 110 activates a bit line selection signal Ysel_1 corresponding to the address A1. A memory cell connected to a bit line selected with the bit line selection signal Ysel_1 is read. In parallel with this read operation, a reset signal Res0 is made "H", to discharge residual charge in the bit line read in the previous read cycle.

As described above, in the technology disclosed in the patent literature described above, the read cycle can be sped up by performing the bit line residual discharge following the termination of the read operation in parallel with the read operation in the next cycle.

However, a problem arises in the control of the parallel operation of the bit line residual discharge in a given read cycle with the read operation in the next cycle. Since the bit line residual discharge is performed after the address is changed and the read operation in the next cycle is started, the read operation in the next cycle and the discharge of residual charge in the previously read bit line are performed simultaneously as in the time period t6 to t5 shown in FIG. 11. If the selected bit line in a read cycle and the selected bit line in the next read cycle are adjacent to each other, the potentials of the adjacent bit lines may vary during the read determination operation, resulting in affecting the read determination operation due to noise via coupling capacitance. This may block stable read operation.

SUMMARY OF THE INVENTION

An object of the present invention is providing a semiconductor memory device operative to discharge residual charge in a read bit line in a read cycle, in which the potential of a selected bit line is prevented from varying during read determination operation in one read cycle due to bit line residual discharge in the previous read cycle even if the selected bit line is adjacent to the selected bit line in the previous read cycle.

To solve the prior art problem described above, according to the present invention, the reset state of bit lines selectively connected to a read determination circuit is canceled only during the time when the bit lines are selectively connected to the read determination circuit to perform read operation.

Specifically, the read method for a semiconductor memory device of the present invention is a read method for a semiconductor memory device including a plurality of word lines and a plurality of bit lines, memory cells being placed at respective intersections between the plurality of word lines and the plurality of bit lines, the bit lines being put in a reset state at all times except during read operation, the method including the steps of: canceling the reset state of a bit line only during the time when the bit line is selected for readout and connected to a read circuit; reading information stored in a selected memory cell via the selected bit line; and disconnecting the selected bit line from the read circuit and resetting the selected bit line after completion of the readout of the selected memory cell.

In one embodiment of the read method of the invention, the reset state of the bit line is a state in which the bit line is set at a reference potential.

In another embodiment of the read method of the invention, the cancellation of the reset state of the bit line is performed by releasing the bit line from a reference potential.

Alternatively, the read method for a semiconductor memory device of the present invention is a read method for a semiconductor memory device including a plurality of word lines and a plurality of bit lines, memory cells being placed at respective intersections between the plurality of word lines and the plurality of bit lines, the bit lines being put in a reset state at all times except during read operation, the method including the steps of: selectively connecting a bit line to a read circuit in response to an input address; canceling the reset state of the bit line selectively connected to the read circuit in response to the input address; reading information stored in a selected memory cell via the selected bit line; and disconnecting the selected bit line from the read circuit and resetting the selected bit line after completion of the readout of the selected memory cell.

In one embodiment of the read method of the invention, the step of selectively connecting a bit line to a read circuit and the step of canceling the reset state of the bit line selectively connected to the read circuit are executed roughly simultaneously.

In another embodiment of the read method of the invention, the reset state of the bit line is a state in which the bit line is set at a reference potential.

In yet another embodiment of the read method of the invention, the cancellation of the reset state of the bit line is performed by releasing the bit line from a reference potential.

The read circuit for a semiconductor memory device of the present invention is a read circuit for a semiconductor memory device including a plurality of word lines and a plurality of bit lines, memory cells being placed at respective intersections between the plurality of word lines and the plurality of bit lines, the read circuit including: a bit line reset circuit for resetting the bit lines at all times except during read operation; a selection signal generation circuit for generating a bit line selection signal in response to an input address; a connection circuit for selectively connecting a bit line to the read circuit according to the bit line selection signal; a bit line reset cancellation circuit for canceling the reset state of the bit line selectively connected to the read circuit according to the bit line selection signal; and a read determination circuit for reading information stored in a selected memory cell via the selected bit line.

In one embodiment of the read circuit of the invention, the bit line reset circuit sets the bit lines at a reference potential.

In another embodiment of the read circuit of the invention, the bit line reset cancellation circuit cancels the reset state of the bit lines set by the bit line reset circuit using the bit line selection signal.

The semiconductor memory device of the present invention is a semiconductor memory device including a plurality of word lines and a plurality of bit lines, memory cells being placed at respective intersections between the plurality of word lines and the plurality of bit lines, the device including: a row decoder for selecting a particular word line among the plurality of word lines in response to an input address; a column decoder for outputting a bit line selection signal for selecting a particular bit line among the plurality of bit lines in response to another input address; a read circuit for reading information stored in a selected memory cell; a column selection circuit for selectively connecting a particular bit line among the plurality of bit lines to the read circuit according to the bit line selection signal from the column decoder; and a switch circuit for controlling the conduction state between the bit line and a reference potential according to the bit line selection signal from the column decoder.

In one embodiment of the semiconductor memory device of the invention, the semiconductor memory device further includes a charge circuit for charging a read node at start of read.

In another embodiment of the semiconductor memory device of the invention, the column selection circuit includes N-channel transistors, and the switch circuit includes P-channel transistors whose gate electrodes receive a signal identical to a signal applied to gate electrodes of the N-channel transistors.

In yet another embodiment of the semiconductor memory device of the invention, the current drive capability of the P-channel transistors constituting the switch circuit is extremely small compared with the current drive capability of the charge circuit.

In yet another embodiment of the semiconductor memory device of the invention, the size of the P-channel transistors constituting the switch circuit is small compared with the size of transistors constituting the charge circuit.

In yet another embodiment of the semiconductor memory device of the invention, the column selection circuit includes first N-channel transistors, and the switch circuit includes second N-channel transistors whose gate electrodes receive a signal opposite in polarity to a signal applied to gate electrodes of the first N-channel transistors.

In yet another embodiment of the semiconductor memory device of the invention, the current drive capability of the second N-channel transistors constituting the switch circuit is extremely small compared with the current drive capability of the charge circuit.

In yet another embodiment of the semiconductor memory device of the invention, the size of the second N-channel transistors constituting the switch circuit is small compared with the size of transistors constituting the charge circuit.

Alternatively, the semiconductor memory device of the present invention is a semiconductor memory device including a plurality of word lines and a plurality of bit lines, memory cells being placed at respective intersections between the plurality of word lines and the plurality of bit lines, the device including: a row decoder for selecting a particular word line among the plurality of word lines in response to an input address; a column decoder for outputting a bit line selection signal for selecting a particular bit line among the plurality of bit lines in response to another input address; a read circuit for reading information stored in a selected memory cell; a first column selection circuit for selecting a particular bit line among the plurality of bit lines according to the bit line selection signal from the column decoder; a second column selection circuit for selectively connecting the output of the first column selection circuit to the read circuit according to the bit line selection signal from the column decoder; and first and second switch circuits for controlling the conduction state between the bit line and a reference potential according to the bit line selection signal from the column decoder.

In one embodiment of the semiconductor memory device of the invention, the semiconductor memory device further includes a charge circuit for charging a read node at start of read.

In another embodiment of the semiconductor memory device of the invention, the first column selection circuit includes first N-channel transistors, the second column selection circuit includes second N-channel transistors, the first switch circuit includes first P-channel transistors whose gate electrodes receive a signal identical to a signal applied to gate electrodes of the first N-channel transistors, and the second switch circuit includes second P-channel transistors whose gate electrodes receive a signal identical to a signal applied to gate electrodes of the second N-channel transistors.

In yet another embodiment of the semiconductor memory device of the invention, the current drive capability of the P-channel transistors constituting the first and second switch circuits is extremely small compared with the current drive capability of the charge circuit.

In yet another embodiment of the semiconductor memory device of the invention, the size of the P-channel transistors constituting the first and second switch circuits is small compared with the size of transistors constituting the charge circuit.

In yet another embodiment of the semiconductor memory device of the invention, the first column selection circuit includes first N-channel transistors, the second column selection circuit includes second N-channel transistors, the first switch circuit includes third N-channel transistors whose gate electrodes receive a signal opposite in polarity to a signal applied to gate electrodes of the first N-channel transistors, and the second switch circuit includes fourth N-channel transistors whose gate electrodes receive a signal opposite in polarity to a signal applied to gate electrodes of the second N-channel transistors.

In yet another embodiment of the semiconductor memory device of the invention, the current drive capability of the N-channel transistors constituting the first and second switch circuits is extremely small compared with the current drive capability of the charge circuit.

In yet another embodiment of the semiconductor memory device of the invention, the size of the N-channel transistors constituting the first and second switch circuits is small compared with the size of transistors constituting the charge circuit.

In an embodiment of the read method of the invention, the memory cells are mask ROM cells.

In another embodiment of the read method of the invention, the memory cells are nonvolatile memory cells of a two-layered gate structure having a floating gate.

In yet another embodiment of the read method of the invention, the memory cells are nonvolatile memory cells of a charge trap type having a gate oxide film of an oxide film-nitride film-oxide film (ONO) structure.

Accordingly, in the read method for a semiconductor memory device according to the present invention, bit lines are set at the reset state at all times except during the read operation. The reset state of a selected bit line is canceled only during the time when the bit line is selected and connected to the read circuit for read operation. Therefore, the bit line residual discharge after the read operation can be started without waiting for start of the next read cycle, and thus the read cycle can be shortened and stable read operation can be attained.

In the read method for a semiconductor memory device according to the present invention, bit lines are set at the reset state at all times except during the read operation. The operation of selecting a bit line and connecting the bit line to the read circuit for read operation and the operation of canceling the reset state of the selected bit line are controlled at the same timing. Therefore, shortening of the read cycle at optimum timing can be attained.

In the read circuit for a semiconductor memory device according to the present invention, the bit line residual discharge after the read operation can be controlled with a bit line selection signal. Therefore, the read cycle can be shortened with a simple circuit configuration, and stable read operation can be attained.

In the semiconductor memory device according to the present invention, the selection of a bit line and the bit line residual discharge after the read operation can be controlled with an output signal of the column decoder. Therefore, a memory in which the read cycle is shortened with a simple circuit configuration can be implemented.

In the semiconductor memory device according to the present invention, a plurality of stages of serially connected column selection circuits and parallel connected first and second switch circuits for bit line residual discharge are used. Therefore, shortening of the read cycle with a simple circuit configuration can be attained.

DESCRIPTION OF THE PREFERRED EMBODIMENTS

Hereinafter, preferred embodiments of the present invention will be described with reference to the accompanying drawings.

Embodiment 1

Figure 1:
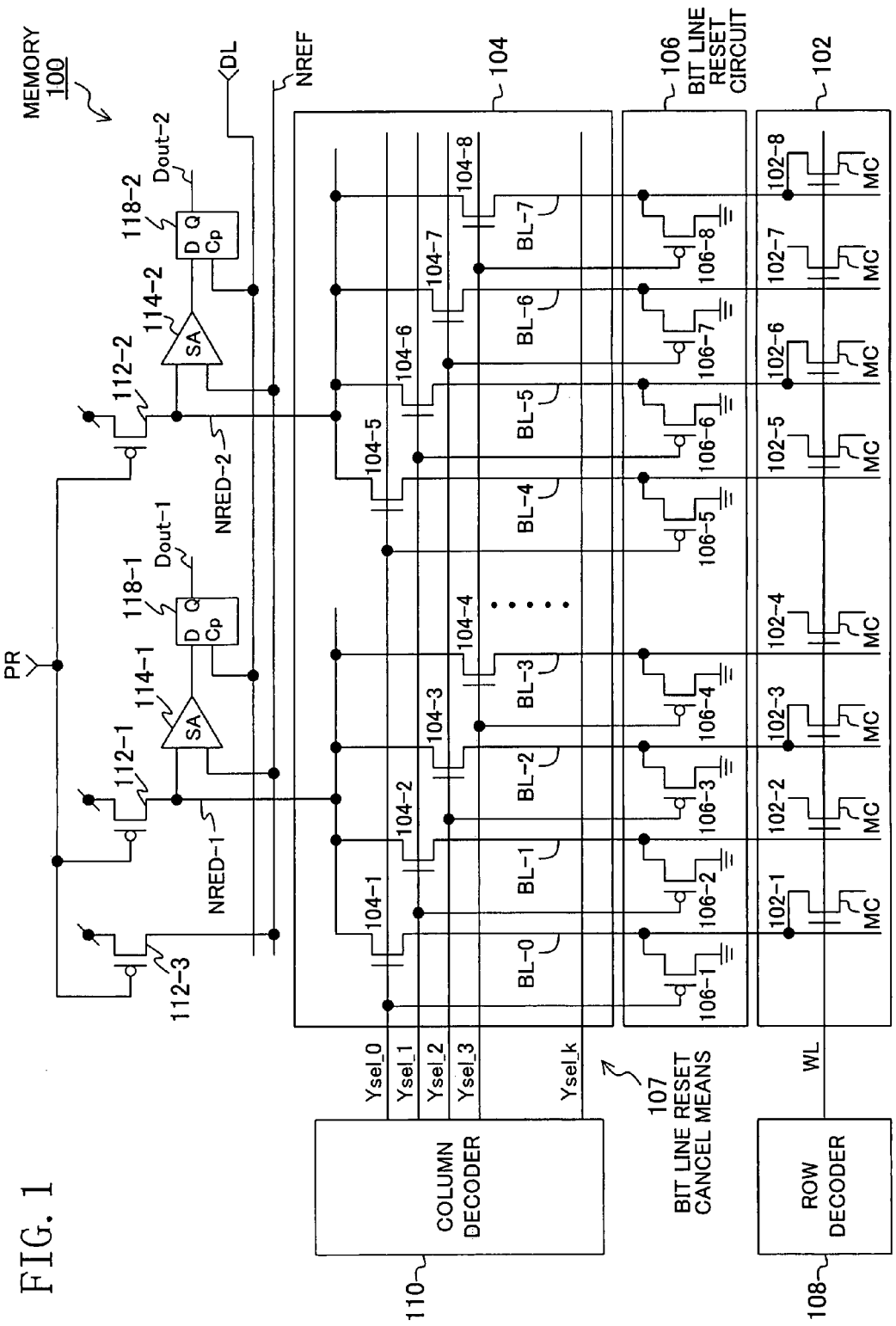
FIG. 1 is a view showing an exemplary memory configuration in Embodiment 1 of the present invention.
Figure 7:
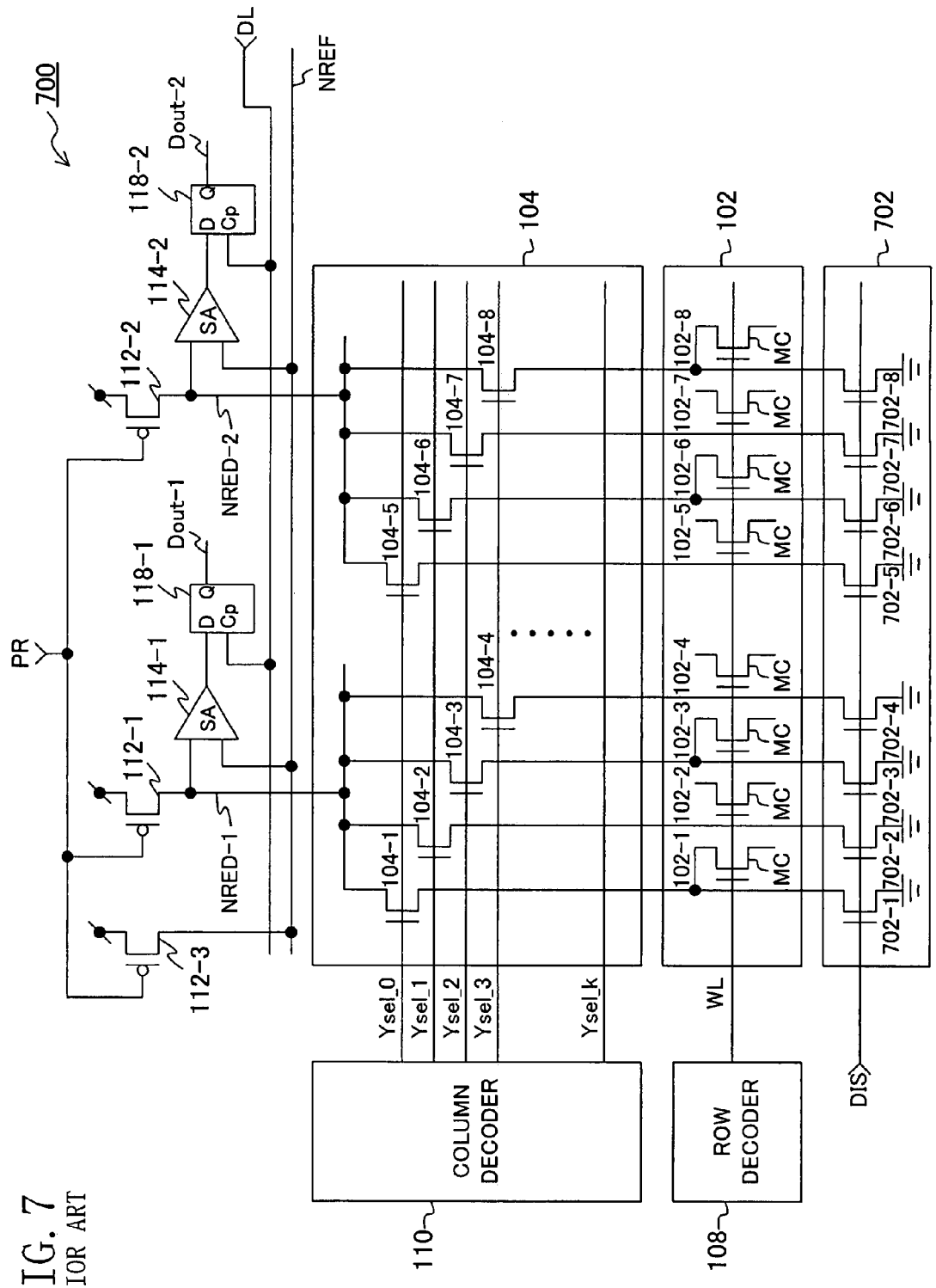
FIG. 7 is a view showing a conventional memory configuration.
Figure 8:
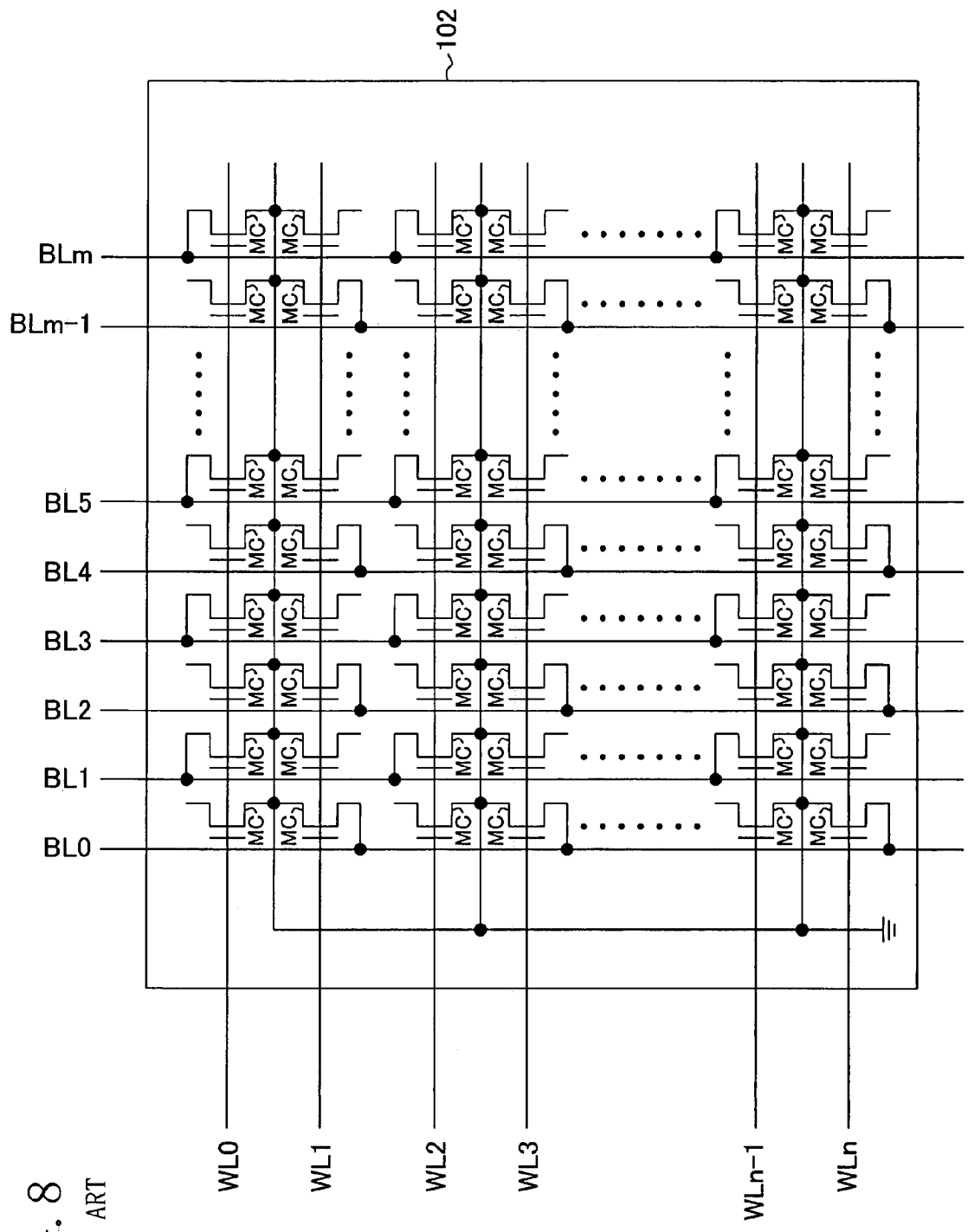
FIG. 8 is a view showing a memory cell array.

FIG. 1 shows an exemplary configuration of a semiconductor memory device of Embodiment 1 of the present invention, in which identical circuit components to those in FIG. 7 are denoted by the same reference numerals. A memory 100 includes a row decoder 108 and a column decoder (selection signal generation circuit) 110. The row decoder 108 selects one of word lines WL running in a memory cell array 102 in response to a row address received externally, to apply a read voltage to the gate electrodes of memory cells MC 102-1 to 102-8. The column decoder 110 generates and outputs bit line selection signals Ysel_0 to Ysel_k for driving a column selection gate 104 in response to a column address received externally. N-channel selection transistors 104-1 to 104-8 in the column selection gate (connection circuit and column selection circuit) 104, driven with the bit line selection signals Ysel_0 to Ysel_k from the column decoder 110, selectively connect bit lines BL-0 to BL-7 that are connected to the drains of the memory cells MC 102-1 to 102-8 to read determination circuits (read circuits and read determination circuits) 114-1 and 114-2.

A bit line reset circuit (bit line reset circuit and switch circuit) 106, composed of P-channel transistors 106-1 to 106-8, discharges residual charge in the bit lines. The gate electrodes of the P-channel transistors 106-1 to 106-8 are connected to the bit line selection signals Ysel_0 to Ysel_k from the column decoder 110 and operate inversely in conduction/non-conduction to the N-channel selection transistors 104-1 to 104-8 in the column selection gate 104 that are connected to the same bit lines. In other words, while the selection transistors 104-1 to 104-8 in the column selection gate 104 are not conducting when no read operation is underway, the P-channel reset transistors 106-1 to 106-8 are conducting to be in the reset state of setting the bit lines at the reference potential when no read operation is underway. The current drive capability of the P-channel reset transistors 106-1 to 106-8 is set at an extremely small value compared with that of precharge transistors 112-1 to 112-3 to be described later. With input of an address signal, one of the selection transistors 104-1 to 104-8 in the column selection gate 104 is selected under control of the bit line selection signals Ysel_0 to Ysel_k from the column decoder 110 and made conducting. At the same time, one of the P-channel reset transistors 106-1 to 106-8 connected to the corresponding bit line is made nonconducting, disconnecting the bit line from the reference potential and thus releasing the reset state of the bit line. Read operation is started in this state. In this way, during selection and conduction of any of the selection transistors 104-1 to 104-8 in the column selection gate 104, the corresponding one of the P-channel reset transistors 106-1 to 106-8 is made nonconducting with the corresponding one of the bit line selection signals Ysel_0 to Ysel_k from the column decoder 110. This constitutes a bit line reset cancel circuit 107.

Figure 2:
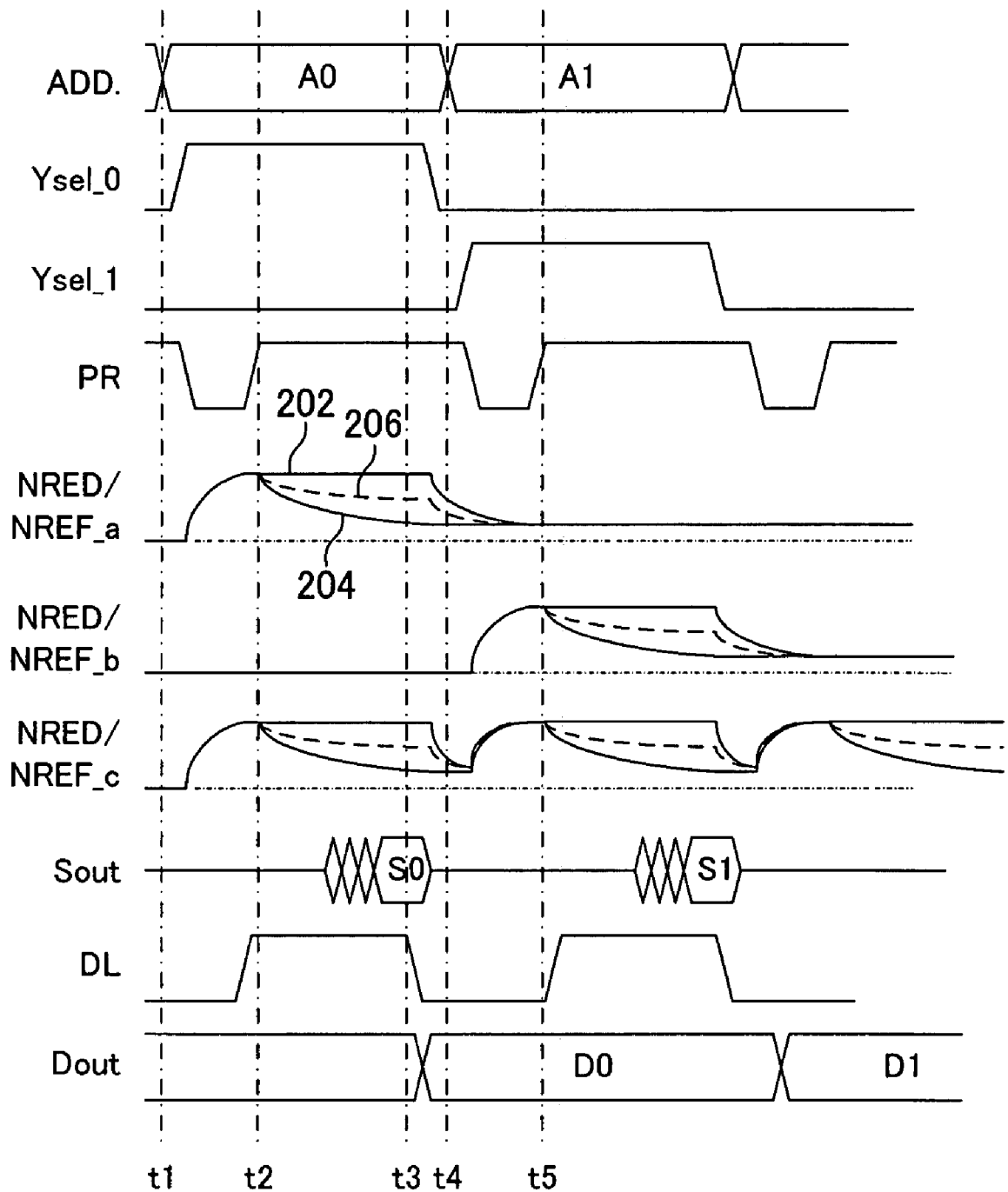
FIG. 2 is a chart illustrating read operation in FIG. 1.

The read operation for data stored in the selected memory cells MC will be described with reference to FIG. 2. In FIG. 2, ADD denotes an input address signal. In response to an address change with input of address A0 at time t1, the row decoder 108 selects a particular word line, the column decoder 110 activates the bit line selection signal Ysel_0 for selecting the bit lines corresponding to the address A0. With the bit line selection signal Yssel_0, the bit lines connected to the memory cells to be selected are connected to the read determination circuits 114-1 and 114-2. Simultaneously, the P-channel reset transistors 106-1 and 106-5 in the bit line reset circuit 106 are made nonconducting releasing the selected bit lines from the reference potential. With the address change at the time t1, a controller (not shown) in the memory generates a precharge signal PR. On receipt of the precharge signal PR, the precharge transistors (charge circuits) 112-1 to 112-3 precharge read nodes NRED-1 and NRED-2 connected to inputs of the read determination circuits 114-1 and 114-2 and a reference input node NREF as the other input of each of the read determination circuits 114-1 and 114-2 to a predetermined potential as shown as NRED/NREF in FIG. 2. In this precharge of the read nodes NRED-1 and NRED-2 to the potential shown, the bit lines BL selected by the column selection gate 104 in response to the bit line selection signal Ysel_0 are also precharged.

Figure 9:
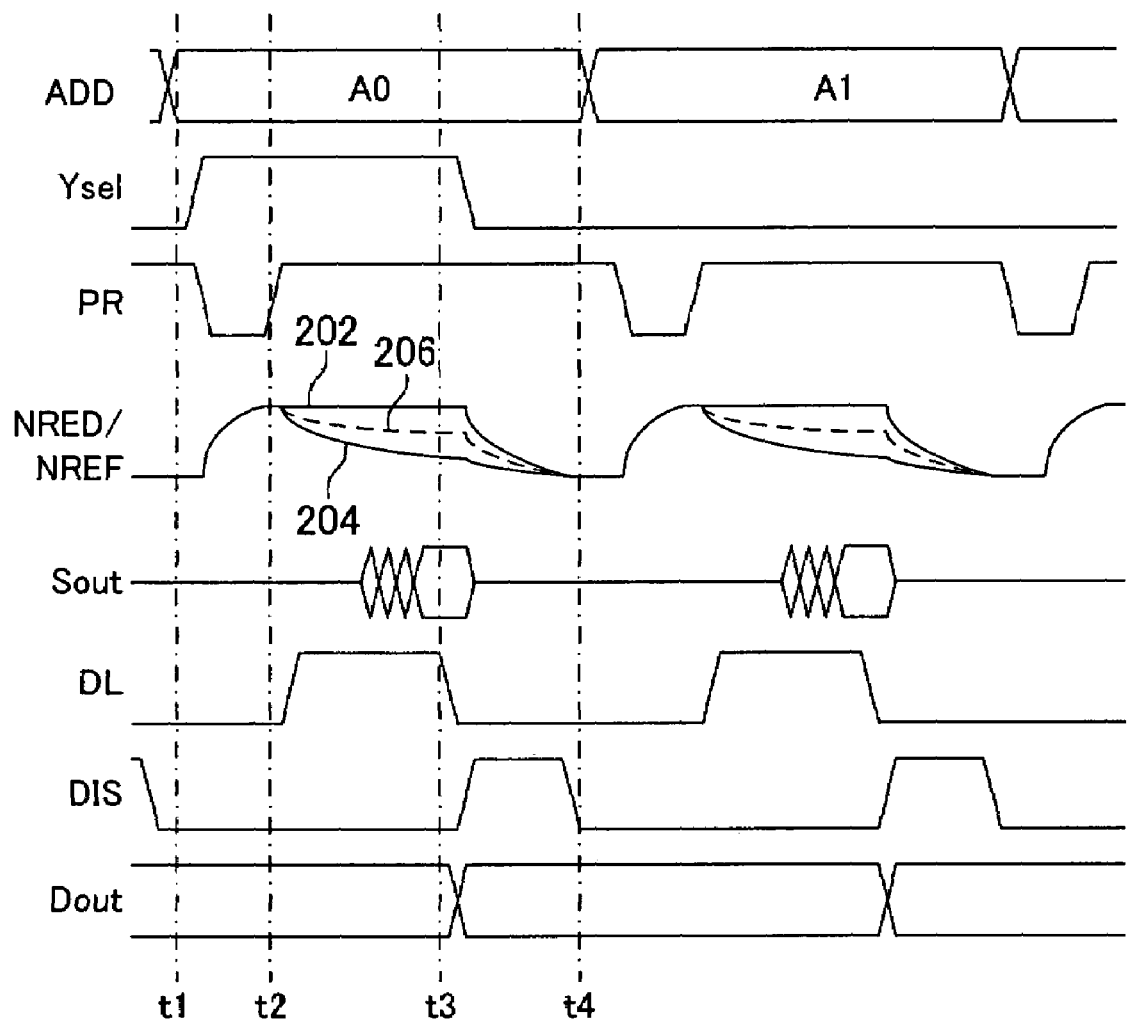
FIG. 9 is a chart illustrating read operation in FIG. 7.
Figure 10:
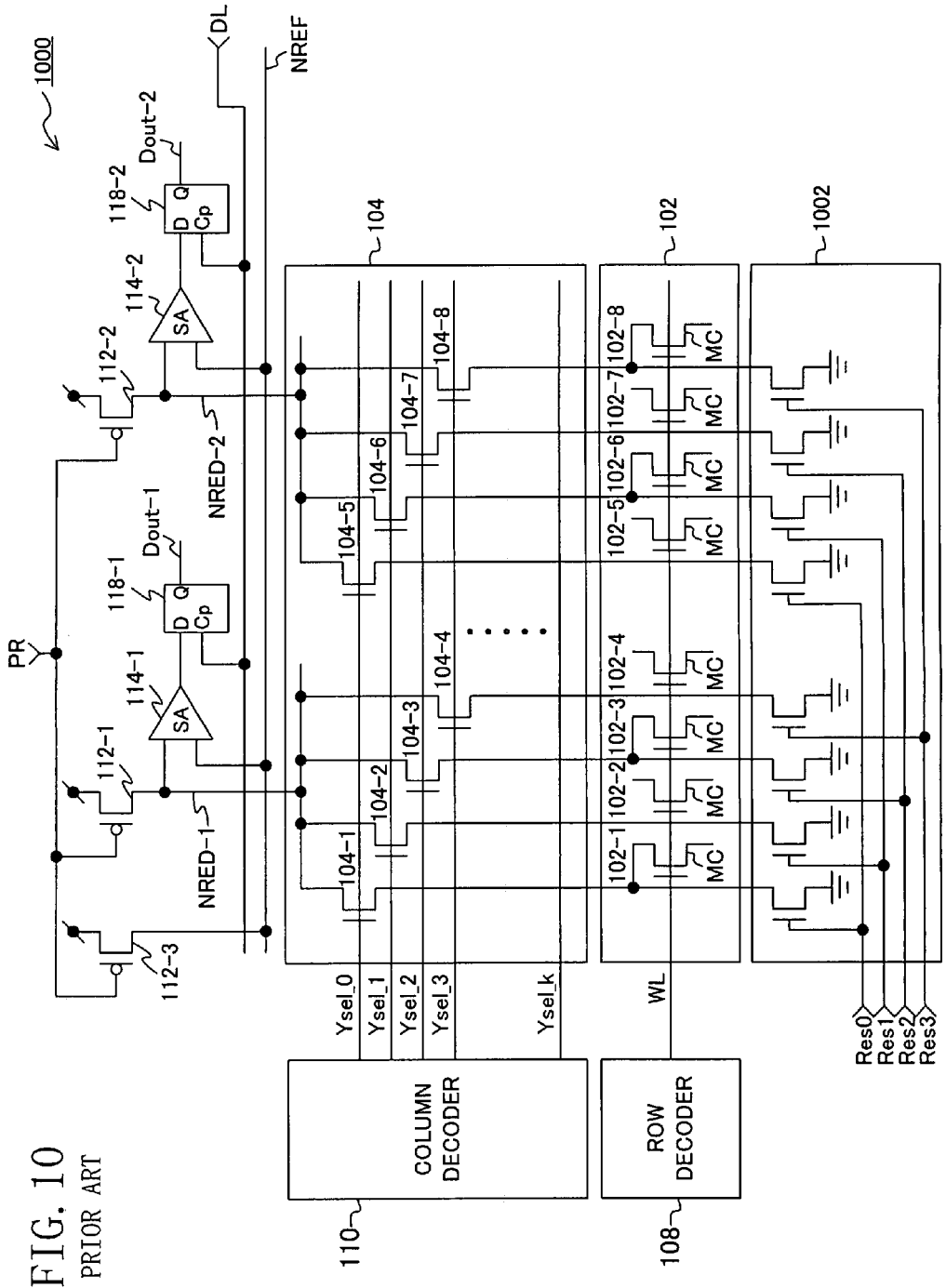
FIG. 10 is a view showing an improved conventional memory configuration.
Figure 11:
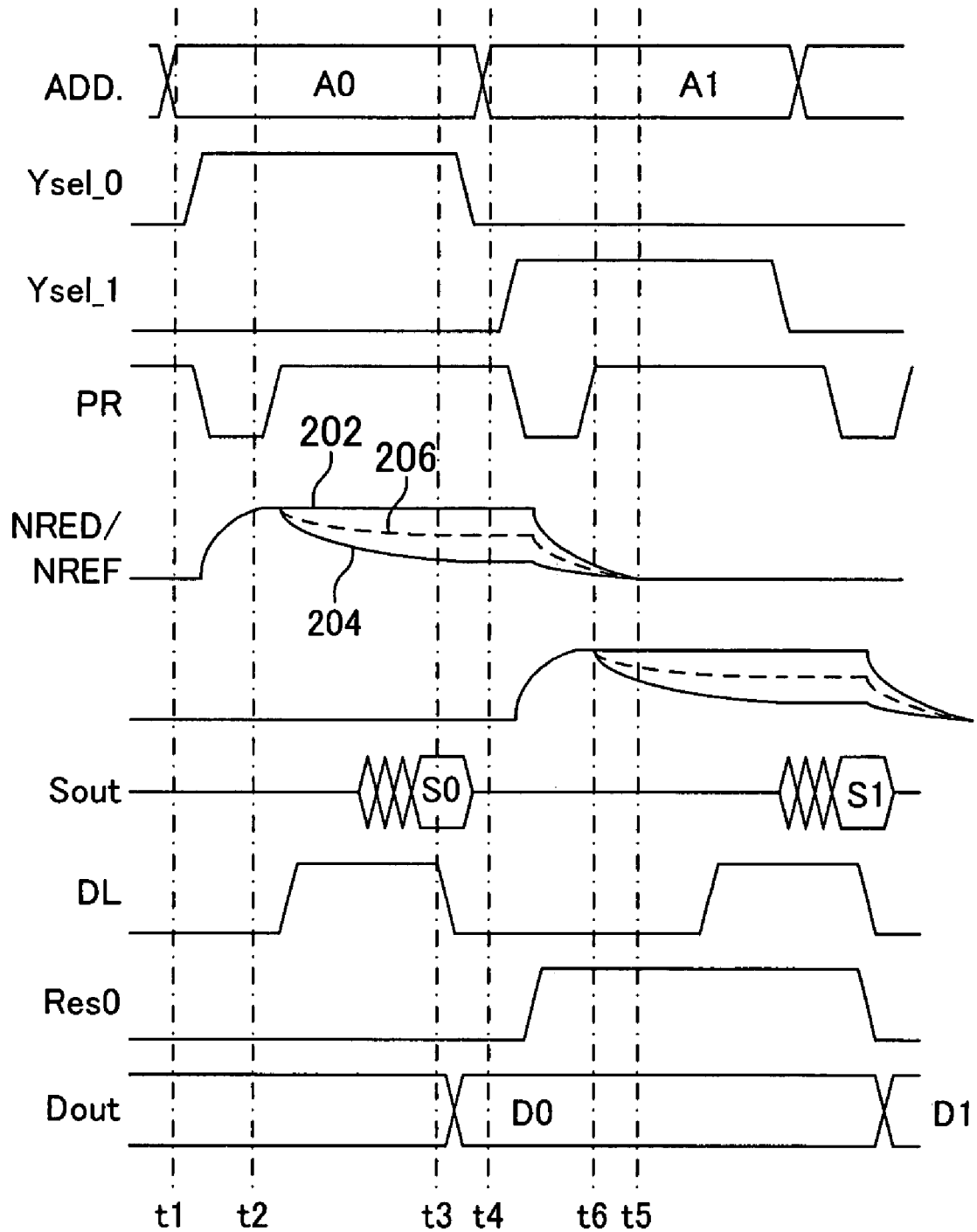
FIG. 11 is a chart illustrating read operation in FIG. 10.

Once the precharge operation is terminated at time t2, the potentials of the read nodes NRED-1 and NRED-2 are discharged according to cell currents at the selected memory cells. Note herein that two types of memory cells 102, one allowing and the other not allowing current flow, exist depending on whether or not the drain terminal of the memory cell is connected to a bit line. If a memory cell MC whose drain is connected to a bit line BL is selected, the charge stored under the precharge operation is discharged with the memory cell current at and after the time t2. The potential therefore changes over time as indicated by 204. If a memory cell MC whose drain is open is selected, the charge stored under the precharge operation is held as it is at and after the time t2, and thus the potential is as indicated by 202. The potential of the reference node NREF, configured to be discharged with a reference current set at a half of the memory cell current, lies in the middle between the read node potentials 202 and 204, as indicated by 206 in FIG. 9. Sout denotes an output waveform of the read determination circuit 114-1 or 114-2. Read data Sout(S0) is finalized at the time when the potential difference between the read node potential 202 or 204 and the reference potential 206 reaches a value required for stable read operation in the read determination circuits 114-1 and 114-2. At timing t3 at which the read data Sout(S0) from the read determination circuits 114-1 and 114-2 is finalized, a signal DL connected to clock terminals Cp of latch circuits 118-1 and 118-2 is lowered, to allow the read data from the read determination circuits 114-1 and 114-2 to be latched by the latch circuits 118-1 and 118-2. Output data Dout(D0) is then outputted from the latch circuits 118-1 and 118-2.

Once the latching of the outputs of the read determination circuits 114-1 and 114-2 by the latch circuits 118-1 and 118-2 is completed, the read determination circuits 114-1 and 114-2 are inactivated. Also, the output signal Ysel_0 of the column decoder 110 is made "L", bringing the selection transistors 104-1 and 104-5 in the column selection gate 104 out of conduction and the P-channel reset transistors 106-1 and 106-5 connected to the corresponding bit lines into conduction, to discharge residual charge in the read bit lines.

The read operation in the next cycle is started prior to completion of the bit line residual discharge in the previous read cycle. Once read address A1 for the next cycle is inputted at time t4 when the bit line residual discharge by the P-channel reset transistors 106-1 and 106-5 is still underway in the previous read cycle, the read operation in the next cycle is executed as was executed in the previous cycle. That is, the read nodes are precharged in response to the change in address signal and the read determination operation is performed by the discharge with the memory cell current after the termination of the precharge time.

If a bit line selected with the input address A1 is different from a bit line selected with the previous input address A0, the precharge operation for the read operation in the next cycle can be performed in parallel with the bit line residual discharge operation in the previous read cycle during the time period t3 to t5, as shown by read node potentials NRED/NREF_a and NRED/NREF_b. In the operation in the previous read cycle shown by NRED/NREF_a, the bit line residual discharge operation is started after the completion of the read determination operation without waiting for start of the next cycle. The discharge operation can therefore be completed within the precharge operation time in the next read cycle. Thus, even if the bit line selected in the next read cycle is adjacent to the bit line selected in the previous read cycle, the read operation can be performed without being affected by noise due to the discharge operation.

If a bit line selected with the input address A1 is identical to a bit line selected with the previous input address A0, the same bit line is switched to the precharge operation in the next read cycle midway during the bit line discharge time after the completion of the read operation at the time t3, as shown by read node potentials NRED/NREF_c. Since the precharge is an operation for setting the read nodes at desired potentials, the operation will not be affected by existence of residual charge in the bit line if any.

As described above, for the read operation for memory cells, a reset transistor connected to a selected bit line is made nonconducting only during the time when the corresponding selection transistor in the column selection gate 104 for selecting a bit line in response to an input address is conducting. Under this control, the bit line discharge operation can be performed in parallel with the precharge operation for the read operation in the next cycle, and thus the read cycle can be shortened while stable read operation is attained.

Embodiment 2

In the configuration shown in FIG. 1, the selection transistors 104-1 to 104-8 in the column selection gate 104 are N-channel transistors while the bit line reset circuit 106 is composed of the P-channel transistors 106-1 to 106-8, so that the selection signals Ysel_0 to Ysel_k from the column decoder 110 can be used, as common control signals. In this configuration, however, since the bit line reset circuit 106 composed of the P-channel transistors performs the discharge to the ground potential, the potential equal to the threshold voltage of the P-channel transistors remains as the bit line potential after the reset. Therefore, the effect of noise discussed in the prior art problem, which occurs when charge remains in a number of bit lines and the residual charge is discharged at one time via memory cells at the time of transition to a different word line, remains to some extent.

Figure 3:
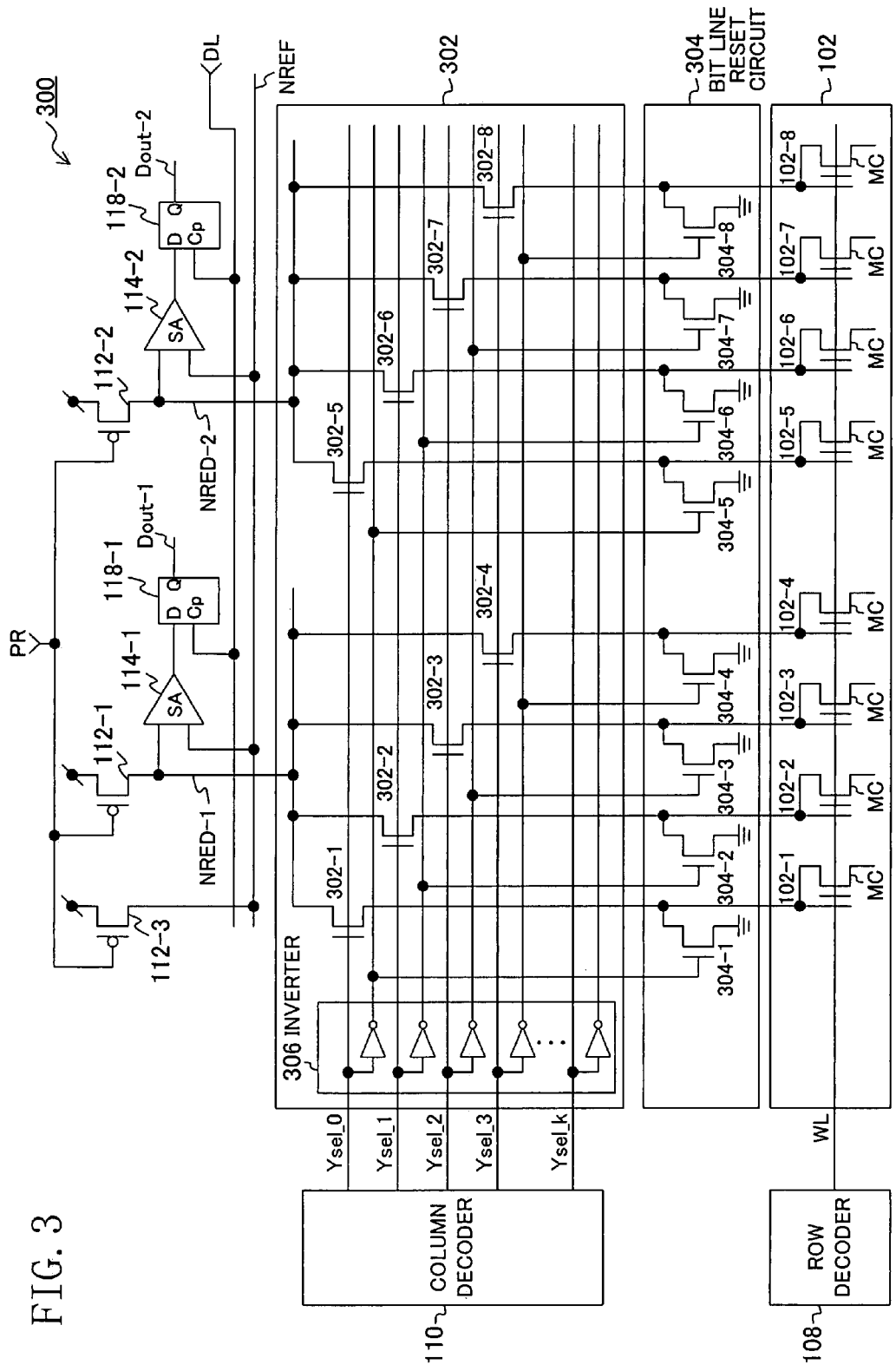
FIG. 3 is a view showing an exemplary memory configuration in Embodiment 2 of the present invention.

FIG. 3 shows an exemplary circuit configuration in which the residual charge after the bit line reset is made zero. A memory 300 shown in FIG. 3 is different from the memory 100 in FIG. 1 in that a bit line reset circuit 304 is composed of N-channel transistors (second N-channel transistors) 304-1 to 304-8 of the same polarity as N-channel transistors (first N-channel transistors) 302-1 to 302-8 constituting a column selection gate 302, and inverters 306 invert the bit line selection signals Ysel_0 to Ysel_k outputted from the column decoder 110 to be used to drive the gates of the N-channel transistors 304-1 to 304-8.

Thus, the N-channel transistors 304-1 to 304-8 constituting the bit line reset circuit 304 can operate inversely in conduction/non-conduction to the N-channel transistors 302-1 to 302-8 in the column selection gate 302, like the P-channel transistors 106-1 to 106-8 constituting the bit line reset circuit 106 shown in FIG. 1. In the configuration shown in FIG. 3, in which the reset operation for the bit lines is performed by the N-channel transistors 304-1 to 304-8 in the bit line reset circuit 304, the residual charge in the bit lines can be discharged so that the potential of the bit lines becomes a value equal to the ground potential.

Figure 4:
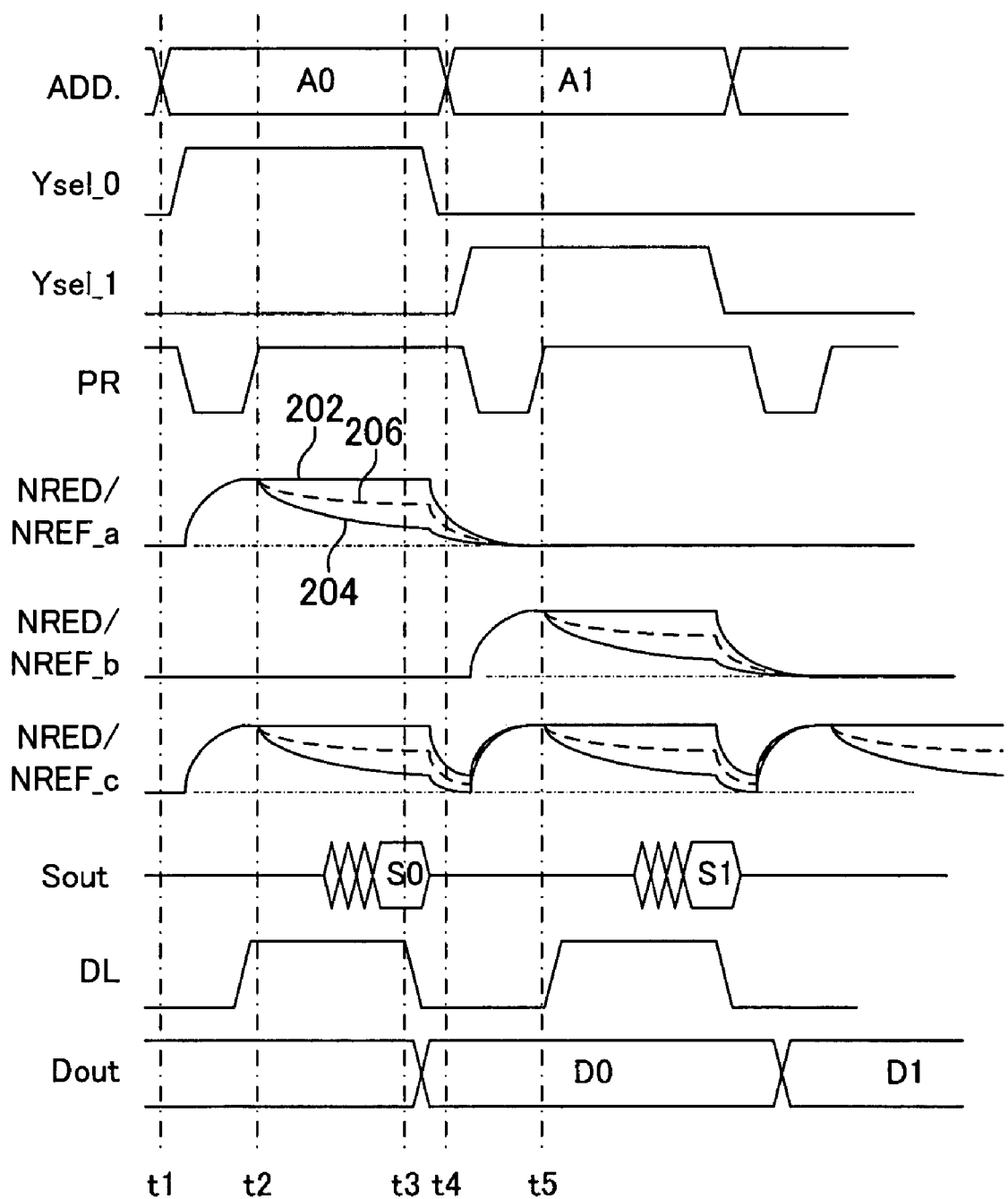
FIG. 4 is a chart illustrating read operation in FIG. 3.

FIG. 4 shows operation waveforms of the memory shown in FIG. 3, which is different from those shown in FIG. 2 in that in the bit line reset operation after the read determination operation with the read nodes NRED/NREF_a and NRED/NREF_b as described above, the residual charge is discharged to the level close to the ground potential with the N-channel transistors 304-1 to 304-8.

As described above, with the configuration shown in FIG. 3, the residual charge can be reduced to nearly zero with the discharge operation after the read operation for the selected bit lines. This makes it possible to reduce the effect of noise due to the discharge of residual charge via memory cells at the time of transition to a different word line with an address change.

Embodiment 3

In FIGS. 1 and 3, shown were examples where the column selection gates 104 and 302 were composed of one stage of the selection transistors 104-1 to 104-8 and 302-1 to 302-8 connected to the bit lines. The column selection gate may otherwise be composed of a plurality of serially connected stages for the purpose of reducing the number of bit line selection signals from the column decoder 110 required.

Figure 5:
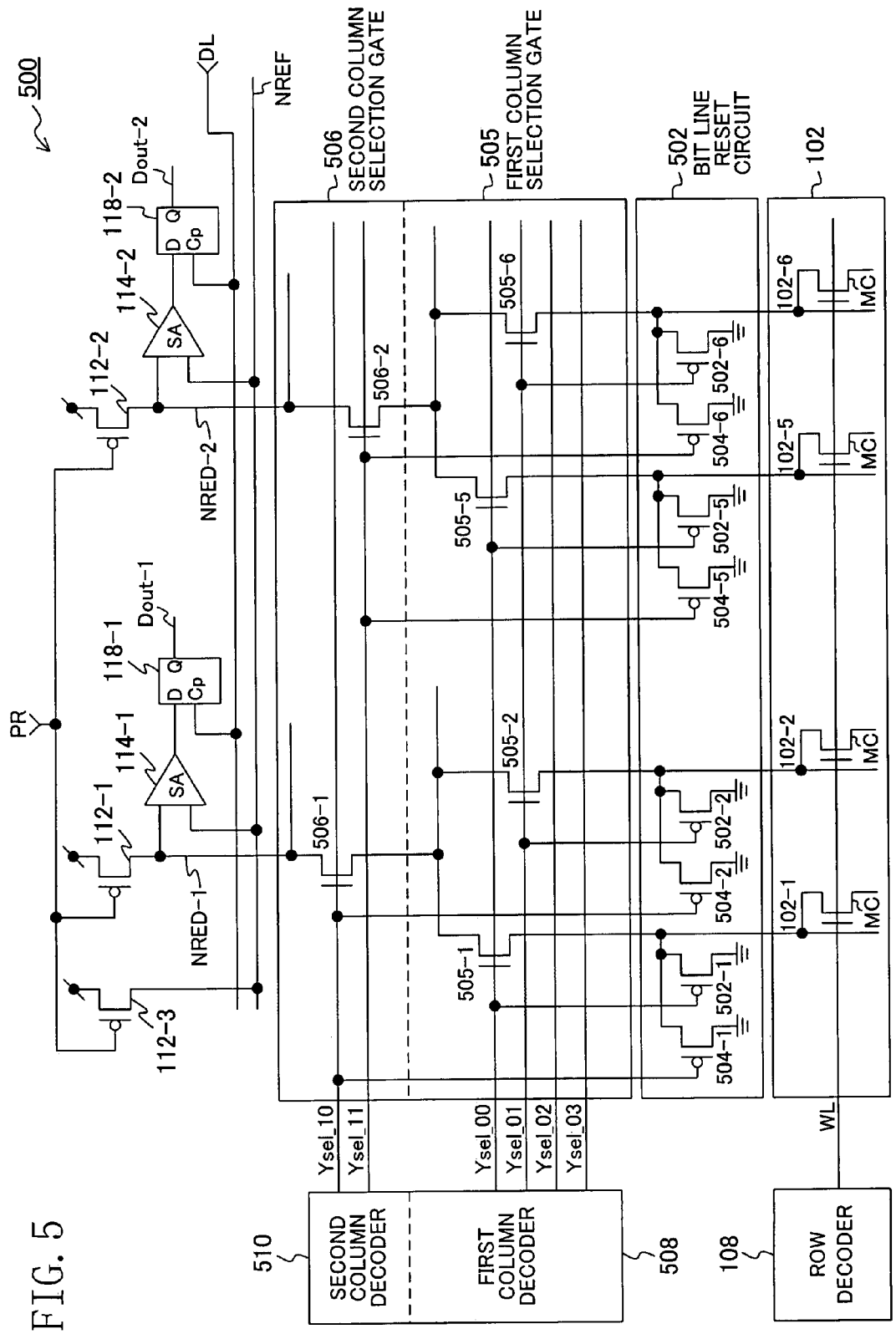
FIG. 5 is a view showing an exemplary memory configuration in Embodiment 3 of the present invention.

FIG. 5 shows an exemplary memory configuration in which the column selection gate is composed of two serially connected stages of selection transistors. In a memory 500 shown in FIG. 5, the column selection gate has a two-stage structure including a first column selection gate (first column selection circuit) 505 composed of first N-channel transistors 505-1, 505-2, 505-5 and 505-6 and a second column selection gate (second column selection circuit) 506 composed of second N-channel transistors 506-1 and 506-2. The N-channel transistors are respectively driven with bit line selection signals Ysel_00 to Ysel_03 outputted from a first column decoder 508 and bit line selection signals Ysel_10 and Ysel_11 outputted from a second column decoder 510. In selection of bit lines corresponding to an input address, bit lines connected to selection transistors that are both conducting, among combinations of the serially connected selection transistors in the first column selection gate 505 and the second column selection gate 506, are connected to the read determination circuits 114-1 and 114-2.

With the configuration shown in FIG. 5, the number of bit line selection signals outputted from the column decoder can be widely reduced.

In the memory configuration shown in FIG. 5 in which the column selection gate is of a two-stage structure including the first and second column selection gates 505 and 506, a bit line reset circuit 502 includes first P-channel reset transistors (first switch circuits) 502-1 to 502-6 driven with the selection signals outputted from the first column decoder 508 and second P-channel reset transistors (second switch circuits) 504-1 to 504-6 driven with the selection signals outputted from the second column decoder 510. Each of the first P-channel reset transistors and each of the second P-channel reset transistors are connected in parallel to each bit line.

With the above configuration, for readout of a selected memory cell, two parallel-connected P-channel transistors, which are connected to a bit line connected to selection transistors that are both conducting among combinations of the serially connected selection transistors in the first column selection gate 505 and the second column selection gate 506, are both made nonconducting, to cancel the reset state of the selected bit line and thus execute the read operation. As for two parallel-connected P-channel transistors connected to a bit line other than the selected bit line, one or both of the transistors are conducting, and thus the bit line holds the reset state.

Thus, the memory shown in FIG. 5 can perform the same read operation as that shown in the timing chart in FIG. 2 except that two types of bit line selection signals become "H" simultaneously to drive the column selection gates 505 and 506 connected in series.

Note that in the memory configuration shown in FIG. 5, in which the bit line reset circuit 502 is composed of the P-channel transistors, charge equivalent of the threshold voltage remains in the bit line residual discharge after the read operation, as described with reference to FIG. 2. In the memory configuration having the two-stage column selection gate shown in FIG. 5, also, the bit line reset circuit may be composed of N-channel transistors and the gate electrodes of the N-channel transistors may be driven with signals obtained by inverting the bit line selection signals outputted from the first and second column decoders 508 and 510. With such a configuration, the bit lines can be discharged to the reference potential without leaving charge behind after the read operation, as described above with reference to FIGS. 3 and 4.

Embodiment 4

As described above, in the circuit configurations shown in FIGS. 1, 3 and 5, to ensure completion of the residual discharge operation in the previous cycle during the precharge operation of a bit line selected for read, the bit line reset transistors 106, 304 and 502 must have the same degree of current drive capability as the precharge transistors 112.

Therefore, the layout area of the bit line reset transistors 106, 304, 502, required to be placed at the bit line pitch, is too large to be negligible. In particular, in the configuration of using a plurality of stages of column selection gates as shown in FIG. 5, in which a plurality of different bit line reset transistors for each bit line must be placed at the bit line pitch, the layout area of these transistors increases, and this blocks low cost implementation.

A means for suppressing the increase in the layout area of the bit line reset transistors and also suppressing the effect of noise due to the residual discharge will be described.

Figure 6:
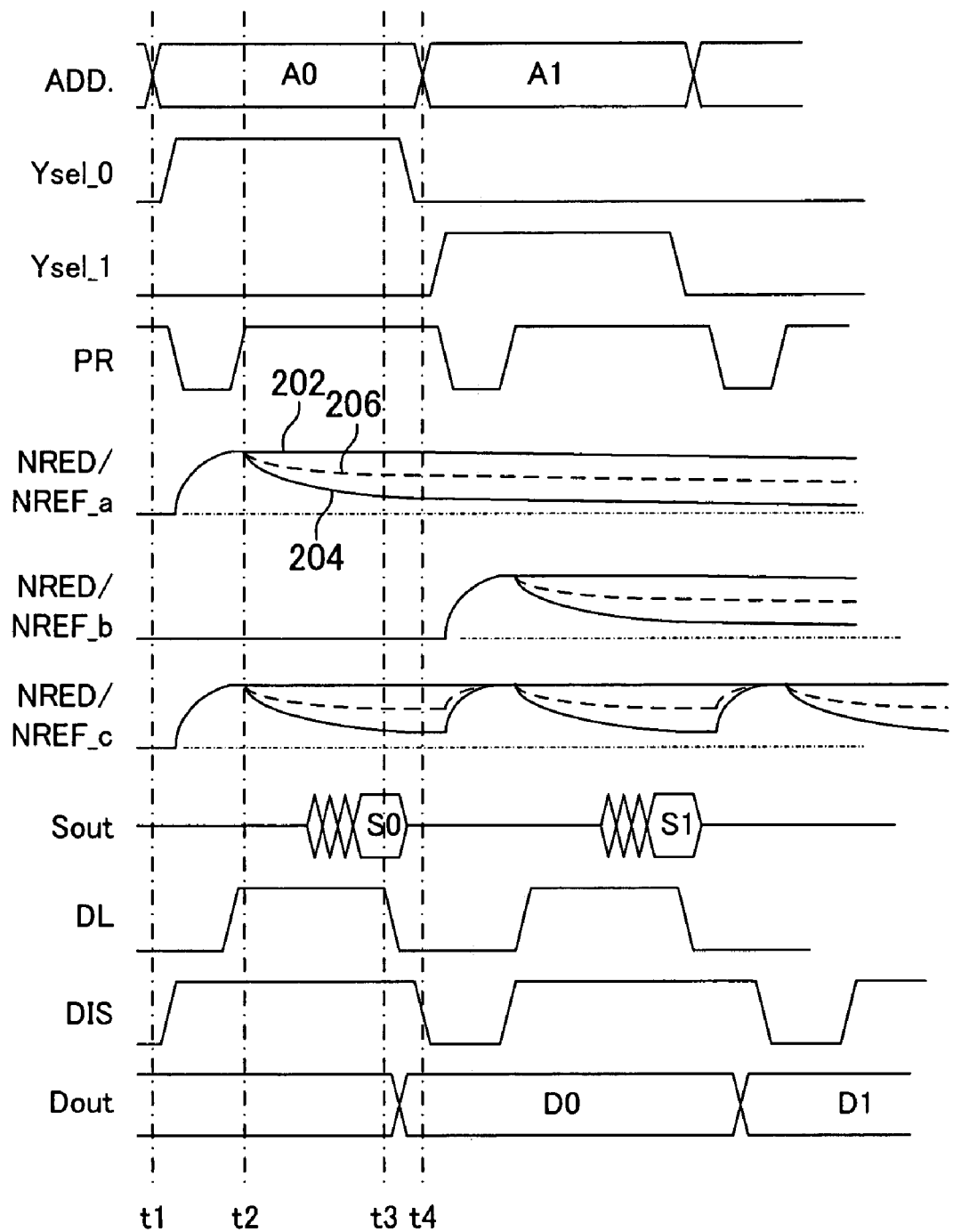
FIG. 6 is a chart illustrating read operation in Embodiment 4.

FIG. 6 shows a timing chart illustrating read operation in the same circuit configuration as that of FIG. 5 in which however the current drive capability of the P-channel reset transistors 502 is set at a small value.

Referring to FIG. 6, the operation is the same as that described with reference to FIG. 2 from the input of address A0 at time t1 until read data is latched by the latch circuit 118 at time t3. Once the latching of the read data by the latch circuit 118 is completed, the P-channel reset transistor 502 connected to the bit line in question becomes conducting, discharging residual charge in the read bit line. At this time, since the current drive capability of the P-channel reset transistor 502 is a small value, the potentials of read nodes NRED/NREF_a fall in a mild slope with the small drive current of the P-channel reset transistor 502.

If a bit line selected in the read in the next cycle started at time t4 is different from the bit line selected in the read in the previous cycle, the potentials of read nodes NRED/NREF_b are precharged at and after the time t4 and subsequently subjected to read determination operation. During these operations, the residual discharge of the bit line selected in the read in the previous cycle is being performed mildly as is found from the potentials of the nodes NRED/NREF_a.

As described above, by setting the current capability of the P-channel reset transistors 502 at a small value, the read operation in the next cycle and the residual discharge operation for the bit line selected in the previous cycle can be executed in parallel. Thus, even if the bit line selected in the read operation in the next cycle is adjacent to the bit line selected in the read in the previous cycle, the effect of noise due to the bit line residual discharge can be suppressed. The current capability of the P-channel reset transistors 502 can be set so that the bit line residual discharge after the read operation is completed after subsequent execution of a plurality of cycles of read operation. With this, the conventional problem of causing a malfunction due to in-unison discharge of residual charge in a number of bit lines can be avoided.

If a bit line selected with input address A1 is identical to the bit line selected with the input address A0, the same bit line is switched to the precharge operation in the next read cycle midway during the bit line discharge time after the completion of the read operation at the time t3, as shown by the potentials of read nodes NRED/NREF_c. Since the precharge is an operation for setting the read nodes at desired potentials, the operation will not be affected by existence of residual charge in the bit line if any.

In the examples described above, the mask ROM was used as the memory. Naturally, like behaviors will also be observed as the circuit operation for memories in which information is stored as the magnitude of the read current value, such as nonvolatile memories like PROM, EPROM, EEPROM and flash EEPROM of two-layered gate structure having a floating gate in each memory cell and nonvolatile memories of a charge trap type using a gate oxide film of an oxide film-nitride film-oxide film (ONO) structure.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A read method for a semiconductor memory device comprising a plurality of word lines and a plurality of bit lines, memory cells being placed at respective intersections between the plurality of word lines and the plurality of bit lines, the bit lines being put in a reset state at all times except during read operation, the method comprising the steps of:
canceling the reset state of a bit line only during the time when the bit line is selected for readout and connected to a read circuit;
reading information stored in a selected memory cell via the selected bit line; and
disconnecting the selected bit line from the read circuit and resetting the selected bit line after completion of the readout of the selected memory cell.

2. The method of claim 1, wherein the reset state of the bit line is a state in which the bit line is set at a reference potential.

3. The method of claim 1, wherein the cancellation of the reset state of the bit line is performed by releasing the bit line from a reference potential.

4. A read method for a semiconductor memory device comprising a plurality of word lines and a plurality of bit lines, memory cells being placed at respective intersections between the plurality of word lines and the plurality of bit lines, the bit lines being put in a reset state at all times except during read operation, the method comprising the steps of:
selectively connecting a bit line to a read circuit in response to an input address;
canceling the reset state of the bit line selectively connected to the read circuit in response to the input address;
reading information stored in a selected memory cell via the selected bit line; and
disconnecting the selected bit line from the read circuit and resetting the selected bit line after completion of the readout of the selected memory cell.

5. The method of claim 4, wherein the step of selectively connecting a bit line to a read circuit and the step of canceling the reset state of the bit line selectively connected to the read circuit are executed roughly simultaneously.

6. The method of claim 4, wherein the reset state of the bit line is a state in which the bit line is set at a reference potential.

7. The method of claim 4, wherein the cancellation of the reset state of the bit line is performed by releasing the bit line from a reference potential.

8. A read circuit for a semiconductor memory device comprising a plurality of word lines and a plurality of bit lines, memory cells being placed at respective intersections between the plurality of word lines and the plurality of bit lines, the read circuit comprising:
a bit line reset circuit for resetting the bit lines at all times except during read operation;
a selection signal generation circuit for generating a bit line selection signal in response to an input address;
a connection circuit for selectively connecting a bit line to the read circuit according to the bit line selection signal;
a bit line reset cancellation circuit for canceling the reset state of the bit line selectively connected to the read circuit according to the bit line selection signal; and
a read determination circuit for reading information stored in a selected memory cell via the selected bit line.

9. The read circuit of claim 8, wherein the bit line reset circuit sets the bit lines at a reference potential.

10. The read circuit of claim 8, wherein the bit line reset cancellation circuit cancels the reset state of the bit lines set by the bit line reset circuit using the bit line selection signal.

11. A semiconductor memory device comprising a plurality of word lines and a plurality of bit lines, memory cells being placed at respective intersections between the plurality of word lines and the plurality of bit lines, the device comprising:
a row decoder for selecting a particular word line among the plurality of word lines in response to an input address;
a column decoder for outputting a bit line selection signal for selecting a particular bit line among the plurality of bit lines in response to another input address;
a read circuit for reading information stored in a selected memory cell;

a column selection circuit for selectively connecting a particular bit line among the plurality of bit lines to the read circuit according to the bit line selection signal from the column decoder; and a switch circuit for controlling the conduction state between the bit line and a reference potential according to the bit line selection signal from the column decoder.

12. The semiconductor memory device of claim 11, further comprising a charge circuit for charging a read node at start of read.

13. The semiconductor memory device of claim 12, wherein the column selection circuit includes N-channel transistors, and the switch circuit includes P-channel transistors whose gate electrodes receive a signal identical to a signal applied to gate electrodes of the N-channel transistors.

14. The semiconductor memory device of claim 13, wherein the current drive capability of the P-channel transistors constituting the switch circuit is extremely small compared with the current drive capability of the charge circuit.

15. The semiconductor memory device of claim 13, wherein the size of the P-channel transistors constituting the switch circuit is small compared with the size of transistors constituting the charge circuit.

16. The semiconductor memory device of claim 12, wherein the column selection circuit includes first N-channel transistors, and the switch circuit includes second N-channel transistors whose gate electrodes receive a signal opposite in polarity to a signal applied to gate electrodes of the first N-channel transistors.

17. The semiconductor memory device of claim 16, wherein the current drive capability of the second N-channel transistors constituting the switch circuit is extremely small compared with the current drive capability of the charge circuit.

18. The semiconductor memory device of claim 16, wherein the size of the second N-channel transistors constituting the switch circuit is small compared with the size of transistors constituting the charge circuit.

19. A semiconductor memory device comprising a plurality of word lines and a plurality of bit lines, memory cells being placed at respective intersections between the plurality of word lines and the plurality of bit lines, the device comprising:

a row decoder for selecting a particular word line among the plurality of word lines in response to an input address;

a column decoder for outputting a bit line selection signal for selecting a particular bit line among the plurality of bit lines in response to another input address;

a read circuit for reading information stored in a selected memory cell;

a first column selection circuit for selecting a particular bit line among the plurality of bit lines according to the bit line selection signal from the column decoder;

a second column selection circuit for selectively connecting the output of the first column selection circuit to the read circuit according to the bit line selection signal from the column decoder; and first and second switch circuits for controlling the conduction state between the bit line and a reference potential according to the bit line selection signal from the column decoder.

20. The semiconductor memory device of claim 19, further comprising a charge circuit for charging a read node at start of read.

21. The semiconductor memory device of claim 19, wherein the first column selection circuit includes first N-channel transistors, the second column selection circuit includes second N-channel transistors, the first switch circuit includes first P-channel transistors whose gate electrodes receive a signal identical to a signal applied to gate electrodes of the first N-channel transistors, and the second switch circuit includes second P-channel transistors whose gate electrodes receive a signal identical to a signal applied to gate electrodes of the second N-channel transistors.

22. The semiconductor memory device of claim 21, wherein the current drive capability of the P-channel transistors constituting the first and second switch circuits is extremely small compared with the current drive capability of the charge circuit.

23. The semiconductor memory device of claim 21, wherein the size of the P-channel transistors constituting the first and second switch circuits is small compared with the size of transistors constituting the charge circuit.

24. The semiconductor memory device of claim 19, wherein the first column selection circuit includes first N-channel transistors, the second column selection circuit includes second N-channel transistors, the first switch circuit includes third N-channel transistors whose gate electrodes receive a signal opposite in polarity to a signal applied to gate electrodes of the first N-channel transistors, and the second switch circuit includes fourth N-channel transistors whose gate electrodes receive a signal opposite in polarity to a signal applied to gate electrodes of the second N-channel transistors.

25. The semiconductor memory device of claim 24, wherein the current drive capability of the N-channel transistors constituting the first and second switch circuits is extremely small compared with the current drive capability of the charge circuit.

26. The semiconductor memory device of claim 24, wherein the size of the N-channel transistors constituting the first and second switch circuits is small compared with the size of transistors constituting the charge circuit.

27. The method of claim 1, wherein the memory cells are mask ROM cells.

28. The method of claim 1, wherein the memory cells are nonvolatile memory cells of a two-layered gate structure having a floating gate.

29. The method of claim 1, wherein the memory cells are nonvolatile memory cells of a charge trap type having a gate oxide film of an oxide film-nitride film-oxide film (ONO) structure.

* * * * *